(12) United States Patent
Campbell et al.

(10) Patent No.: US 7,233,494 B2
(45) Date of Patent: Jun. 19, 2007

(54) COOLING APPARATUS, COOLED ELECTRONIC MODULE AND METHODS OF FABRICATION THEREOF EMPLOYING AN INTEGRATED MANIFOLD AND A PLURALITY OF THERMALLY CONDUCTIVE FINS

(75) Inventors: Levi A. Campbell, New Paltz, NY (US); Richard C. Chu, Hopewell Junction, NY (US); Michael J. Ellsworth, Jr., Lagrangeville, NY (US); Madhusudan K. Iyengar, Rhinebeck, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 137 days.

(21) Appl. No.: 11/124,064

(22) Filed: May 6, 2005

(65) Prior Publication Data
US 2006/0250773 A1    Nov. 9, 2006

(51) Int. Cl.
*H05K 7/20*    (2006.01)
(52) U.S. Cl. ............... 361/699; 361/698; 257/714; 165/80.4
(58) Field of Classification Search ........ 361/679, 361/698, 699, 709, 716, 718; 257/756–766, 257/714, 715; 165/133, 137.1, 80.3, 80.4, 165/185; 62/259.2; 174/15.1; 438/122; 435/303.1; 29/890.03
See application file for complete search history.

(56) References Cited

U.S. PATENT DOCUMENTS

| | | | |
|---|---|---|---|
| 4,494,171 A * | 1/1985 | Bland et al. ............... | 361/704 |
| 5,016,090 A * | 5/1991 | Galyon et al. ............. | 257/714 |
| 5,070,936 A | 12/1991 | Carroll et al. ............. | 165/80.4 |
| 5,220,804 A | 6/1993 | Tilton et al. .............. | 62/64 |
| 5,263,536 A | 11/1993 | Hulburd et al. ............ | 165/80.4 |
| 5,269,372 A * | 12/1993 | Chu et al. ................ | 165/80.4 |

(Continued)

OTHER PUBLICATIONS

U.S. Patent Application entitled "Fluidic Cooling Systems and Methods for Electronic Components," Pompeo et al., U.S. Appl. No. 10/904,555; filed Nov. 16, 2004.

(Continued)

*Primary Examiner*—Michael Datskovskiy
(74) *Attorney, Agent, or Firm*—Lily Neff, Esq.; Kevin P. Radigan, Esq.; Heslin Rothenberg Farley & Mesiti, P.C.

(57) ABSTRACT

A cooling apparatus and method of fabrication are provided for facilitating removal of heat from a heat generating electronic device. The cooling apparatus includes a plurality of thermally conductive fins coupled to and projecting away from a surface to be cooled. The fins facilitate transfer of heat from the surface to be cooled. The apparatus further includes an integrated manifold having a plurality of inlet orifices for injecting coolant onto the surface to be cooled, and a plurality of outlet openings for exhausting coolant after impinging on the surface to be cooled. The inlet orifices and the outlet openings are interspersed in a common surface of the integrated manifold. Further, the integrated manifold and the surface to be cooled are disposed with the common surface of the manifold and the surface to be cooled in spaced, opposing relation, and with the plurality of thermally conductive fins disposed therebetween.

17 Claims, 8 Drawing Sheets

U.S. PATENT DOCUMENTS

| | | | | |
|---|---|---|---|---|
| 5,270,572 | A | 12/1993 | Nakajima et al. | 257/714 |
| 5,519,151 | A | 5/1996 | Chu al. | 361/699 |
| 5,548,907 | A * | 8/1996 | Gourdine | 34/448 |
| 5,768,103 | A * | 6/1998 | Kobrinetz et al. | 361/699 |
| 5,942,432 | A | 8/1999 | Smith et al. | 435/303.1 |
| 6,431,260 | B1 | 8/2002 | Agonafer et al. | 165/80.4 |
| 6,498,725 | B2 | 12/2002 | Cole et al. | 361/700 |
| 6,571,569 | B1 | 6/2003 | Rini et al. | 62/259.2 |
| 7,017,654 | B2 * | 3/2006 | Kenny et al. | 165/80.4 |
| 2004/0012914 | A1 | 1/2004 | Chu et al. | 361/679 |

OTHER PUBLICATIONS

U.S. Patent Application entitled "Cooling Apparatus, Cooled Electronic Module, And Methods Of Fabrication Thereof Employing Thermally Conductive, Wire-Bonded Pin Fins," Campbell et al., U.S. Appl. No. 11/009,935, filed Dec. 9, 2004.

U.S. Patent Application entitled "Electronic Device Cooling Assembly And Method Employing Elastic Support Material Holding a Plurality Of Thermally Conductive Pins," Campbell et al., U.S. Appl. No. 10/873,432, filed Jun. 22, 2004.

B.R. Hollworth, et al., "Arrays of Impinging Jets with Spent Fluid Removal Through Vent Holes on the Target Surface," Journal of Engineering for Power, vol. 102, pp. 994-999 (Oct. 1980).

* cited by examiner

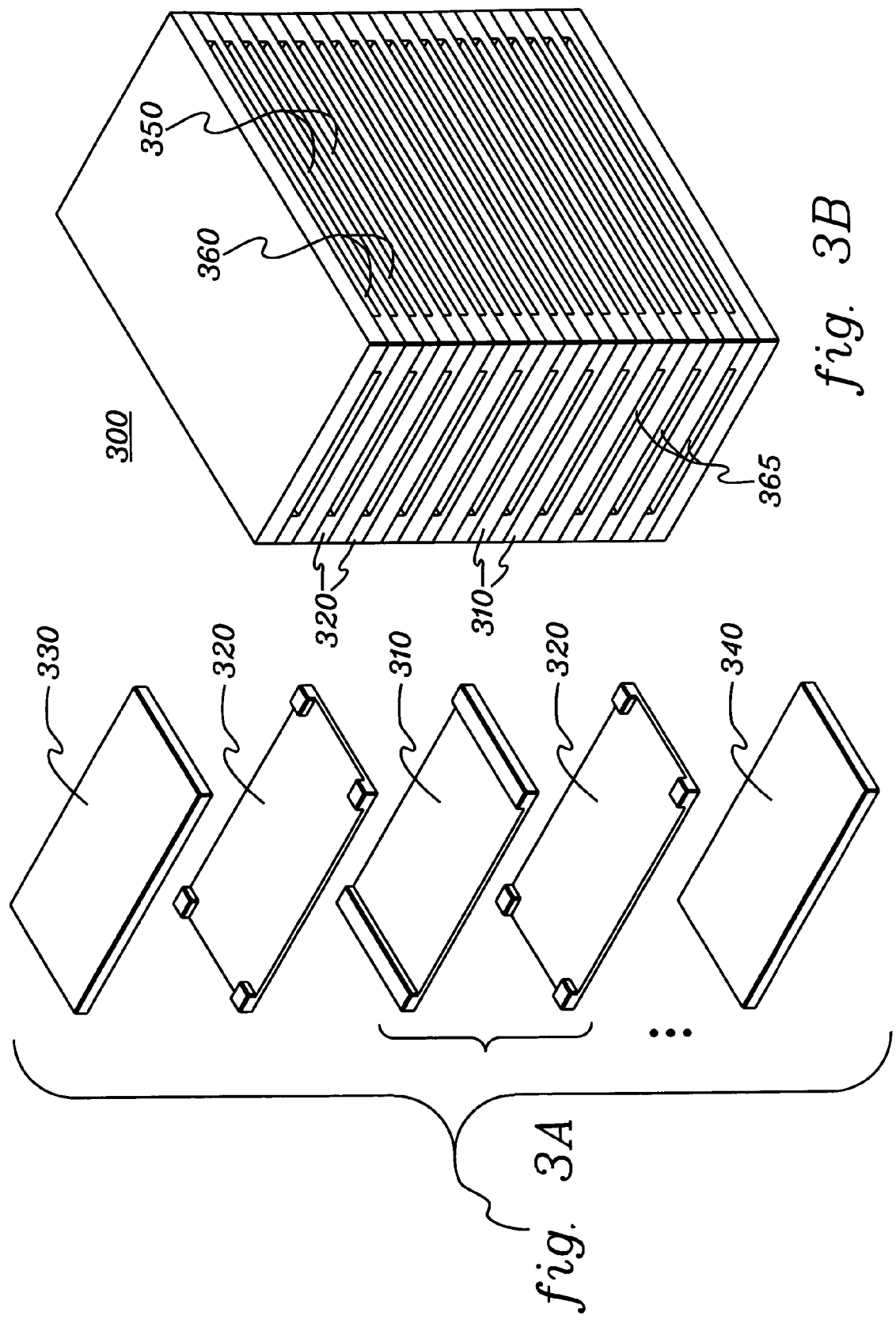

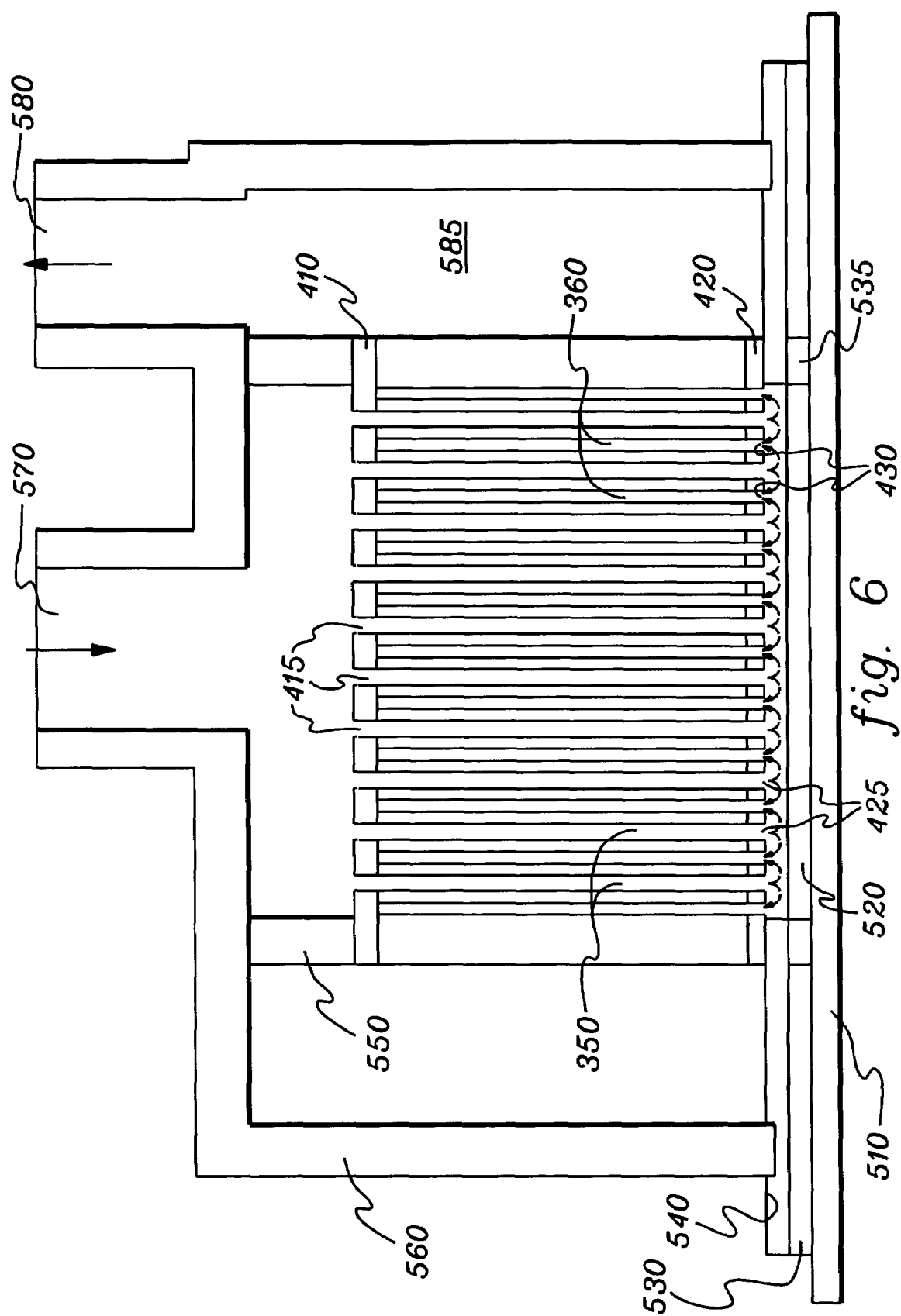

COOLING APPARATUS, COOLED ELECTRONIC MODULE AND METHODS OF FABRICATION THEREOF EMPLOYING AN INTEGRATED MANIFOLD AND A PLURALITY OF THERMALLY CONDUCTIVE FINS

CROSS REFERENCE TO RELATED APPLICATIONS

This application contains subject matter which is related to the subject matter of the following applications, each of which is assigned to the same assignee as this application and each of which is hereby incorporated herein by reference in its entirety:

"Fluidic Cooling Systems and Methods for Electronic Components," Pompeo et al., Ser. No. 10/904,555; filed Nov. 16, 2004, and published May 31, 2006 as U.S. Patent Application Publication No. US 2006/0104031 A1, now U.S. Pat. No 7,079,393, issued Jul. 18, 2006;

"Cooling Apparatus, Cooled Electronic Module, and Methods of Fabrication Thereof Employing Thermally Conductive, Wire-Bonded Pin Fins," Campbell et al., Ser. No. 11/009,935, filed Dec. 9, 2004, and published Jun. 15, 2006 as U.S. Patent Application Publication No. US 2006/0126308 A1;

"Electronic Device Cooling Assembly and Method Employing Elastic Support Material Holding a Plurality of Thermally Conductive Pins," Campbell et al., Ser. No. 10/873,432, filed Jun. 22, 2004, and published Dec. 22, 2005 as U.S. Patent Application Publication No. US 2005/0280993 A1;

"Electronic Device Substrate Assembly With Multilayer Impermeable Barrier and Method of Making", Chu et al., Ser. No. 10/197,661, filed Jul. 17, 2002, and published Jan. 22, 2004 as U.S. Patent Application Publication No. US 2004/0012914 A1, now U.S. Pat. No. 6,940,712, issued Sep. 6, 2005; and "Cooling Apparatus, Cooled Electronic Module and Methods of Fabrication Thereof Employing an Integrated Coolant Inlet and Outlet Manifold," Campbell et al., Ser. No. 11/124,513, filed May 6, 2005, and published Nov. 9, 2006 as U.S. Patent Application Publication No. US 2006/0250774 A1.

TECHNICAL FIELD OF THE INVENTION

The present invention relates to heat transfer mechanisms, and more particularly, the cooling apparatuses, cooled electronic modules and methods of fabrication thereof for removing heat generated by one or more electronic devices. Still more particularly, the present invention relates to cooling apparatuses and methods employing at least one integrated coolant inlet and outlet manifold and a plurality of thermally conductive fins coupled to and extending from a surface to be cooled for facilitating the cooling of an electronic device in an effective and efficient manner with minimum coolant pressure drop across the manifold.

BACKGROUND OF THE INVENTION

As is known, operating electronic devices produce heat. This heat should be removed from the devices in order to maintain device junction temperatures within desirable limits, with failure to remove the heat thus produced resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/$cm^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

Thus, the need to cool current and future high heat load, high heat flux electronic devices, mandates the development of aggressive thermal management techniques, such as liquid jet impingement or liquid cooled microstructure cold plate devices to cool electronic devices, such as integrated circuit chips. The invention disclosed herein is addressed to this continuing need for enhanced liquid based cooling apparatuses and methods of cooling.

SUMMARY OF THE INVENTION

The shortcomings of the prior art are overcome and additional advantages are provided through the provision of a cooling apparatus. The cooling apparatus includes a plurality of thermally conductive fins coupled to and projecting away from a surface to be cooled, wherein the plurality of thermally conductive fins facilitate transferring of heat from the surface to be cooled. The apparatus further includes an integrated manifold having a plurality of inlet orifices for injecting coolant onto the surface to be cooled, and a plurality of outlet openings for exhausting coolant after impinging onto the surface to be cooled. The plurality of inlet orifices and the plurality of outlet openings are interspersed in a common surface of the integrated manifold, and the integrated manifold and the surface to be cooled are disposed with the common surface of the integrated manifold and the surface to be cooled in spaced, opposing relation, and with the plurality of thermally conductive fins disposed therebetween.

In enhanced aspects, at least some fins of the plurality of thermally conductive fins are sized and disposed to extend into at least some outlet openings of the plurality of outlet openings of the integrated manifold to facilitate heat transfer from the surface to be cooled to the coolant. Further, the plurality of inlet orifices comprise a plurality of jet orifices for providing jet impingement of coolant onto the surface to be cooled, and wherein when operational, coolant cools the plurality of fins after impinging on the surface to be cooled. In another enhanced aspect, the common surface of the integrated manifold and the surface to be cooled are spaced less than or equal to 1 mm apart, and the height of each fin of the at least some fins extending into the at least some outlet openings of the integrated manifold is greater than the spacing between the common surface and the surface to be cooled.

A cooled electronic module, methods of fabricating a cooling apparatus and a cooled electronic module, as well as methods for cooling electronic devices are also presented and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 3A is an exploded, isometric view of one embodiment of several types of plates to be assembled into a stack subassembly of an integrated coolant inlet and outlet manifold, in accordance with an aspect of the present invention;

FIG. 3B is an isometric view of one assembled stack subassembly embodiment, employing multiple layers of plates of the types shown in FIG. 3A, in accordance with an aspect of the present invention;

FIG. 6 is a cross-sectional elevational view of the assembled, cooled electronic module of FIG. 5B taken along line A—A, in accordance with an aspect of the present invention;

BEST MODE FOR CARRYING OUT THE INVENTION

As used herein "electronic device" comprises any heat generating electronic component of a computer system or other electronic system requiring cooling. In one example, the electronic device is or includes an integrated circuit chip, a semiconductor chip and/or an electronic component. The term "cooled electronic module" includes any electronic module with cooling and at least one electronic device, with single-chip modules and multi-chip modules being examples of a cooled electronic module as described herein. The "surface to be cooled" refers to a surface of the electronic device itself, or to an exposed surface of a thermal cap, thermal spreader, passivation layer, or other surface in contact with the electronic device, and through which heat generated by the electronic device is to be extracted. As used herein, "micro-scaled cooling structure" means a cooling structure with a characteristic dimension of 200 micrometers (microns) or less.

Generally stated, provided herein are enhanced cooling apparatuses and methods of fabrication which allow for high heat transfer from a surface of an electronic device to be cooled using a direct (or indirect) liquid coolant impingment approach. In one embodiment, the cooling liquid may comprise a water-based, two-phase coolant. However, the concepts disclosed herein are readily adapted to use with other types of coolant, either two-phase or single-phase. For example, the coolant may comprise a brine, a fluorocarbon liquid, a liquid metal, or other similar coolant, or refrigerant, while still maintaining the advantages and unique features of the present invention.

Figure 1:
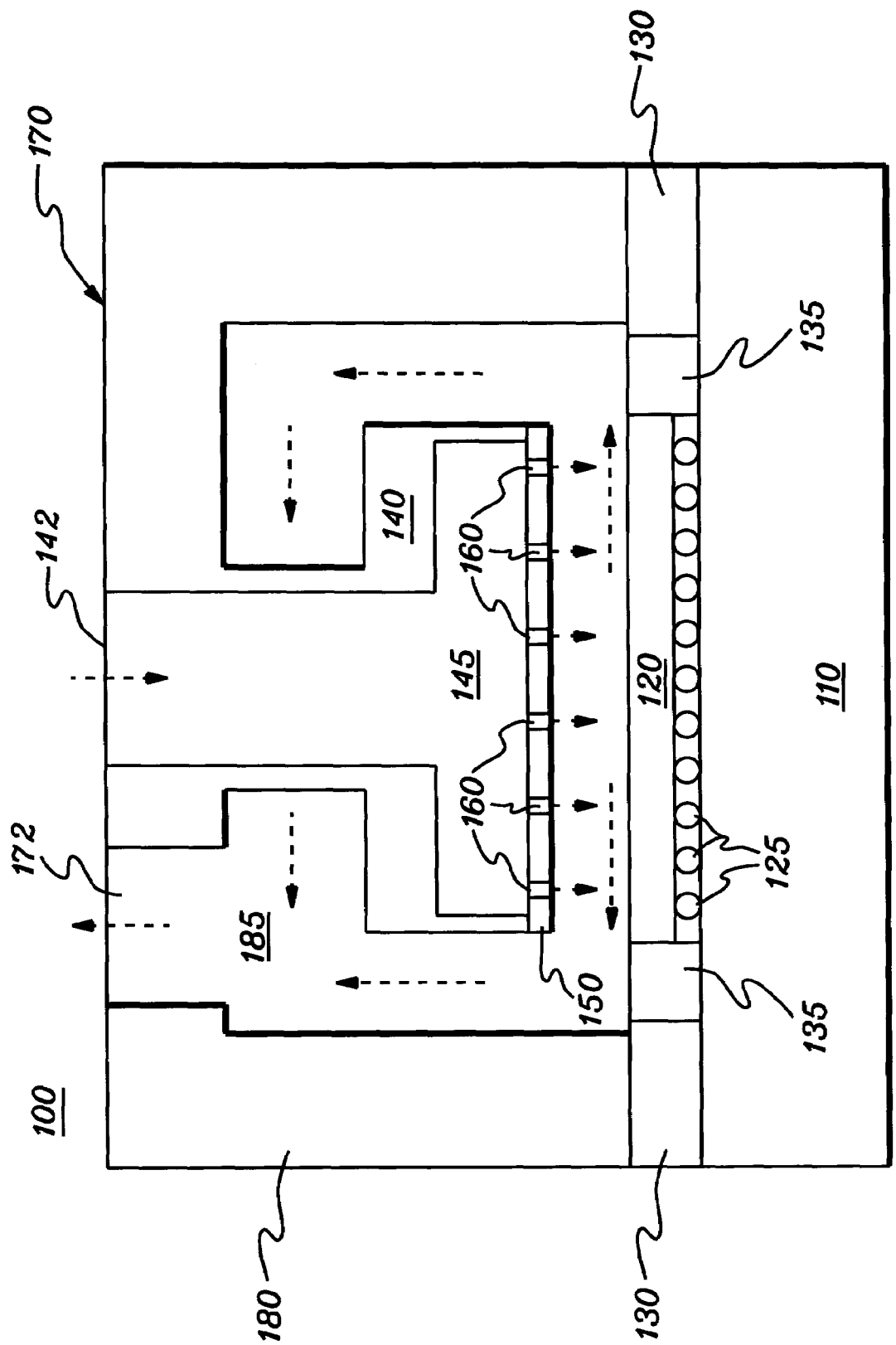
FIG. 1 is a cross-sectional elevational view of one embodiment of a cooled electronic module, in accordance with an aspect of the present invention.

FIG. 1 depicts one embodiment of a cooled electronic module, generally denoted 100, in accordance with an aspect of the present invention. In this embodiment, cooled electronic module 100 includes a substrate 110, which may include conductive wiring (not shown) on an upper surface thereof and/or imbedded therein. An electronic device 120 is electrically connected to the wiring of substrate 110 via, for example, solder ball connections 125 (also referred to as controlled collapse chip connections, or Cis). A sealing structure 130, which in one embodiment could comprise a plate with a center opening, facilitates isolation of the active circuit portion of the electronic device 120, as well as the connections 125 and substrate surface metallurgy, from coolant within the module. A sealant 135, such as an epoxy, provides a fluid-tight seal between sealing structure 130 and chip 120. This seal is desirable if the coolant is aqueous in nature. The housing 170 is sealed to sealing structure 130 via, for example, solder or brazing. Housing 170 includes an inlet plenum housing 140 and an outlet plenum housing 180 (or peripheral return manifold structure). Inlet plenum housing 140 includes an inlet plenum 145 which receives coolant through at least one inlet opening 142 and directs coolant through a plurality of orifices 160, disposed in an orifice plate 150, onto a surface of electronic device 120. In one embodiment, orifices 160 comprise jet orifices which provide an impinging jet flow onto the surface of the electronic device to be cooled. After impinging on the surface to be cooled, the coolant flows over the electronic device surface towards the periphery thereof, where it turns upwards and exits through an outlet manifold 185 via at least one outlet port 172.

In operation, several disadvantages of a cooled electronic module as depicted in FIG. 1 may arise. For example, there may be a prohibitive pressure drop in a two-phase cooling system due to vapor build up between the orifice plate 150 and the electronic device 120. This is because the specific volume of vapor is significantly greater than that of the coolant in liquid phase. Additionally, a large coolant temperature rise may occur when the coolant is a liquid metal (which has a low specific heat characteristic). Further, a potentially poor rate of heat transfer at the periphery of the electronic device may occur due to the effluent wash effect, which exacerbates non-uniformity in the heat transfer coefficient across the surface of the electronic device.

Figure 2:
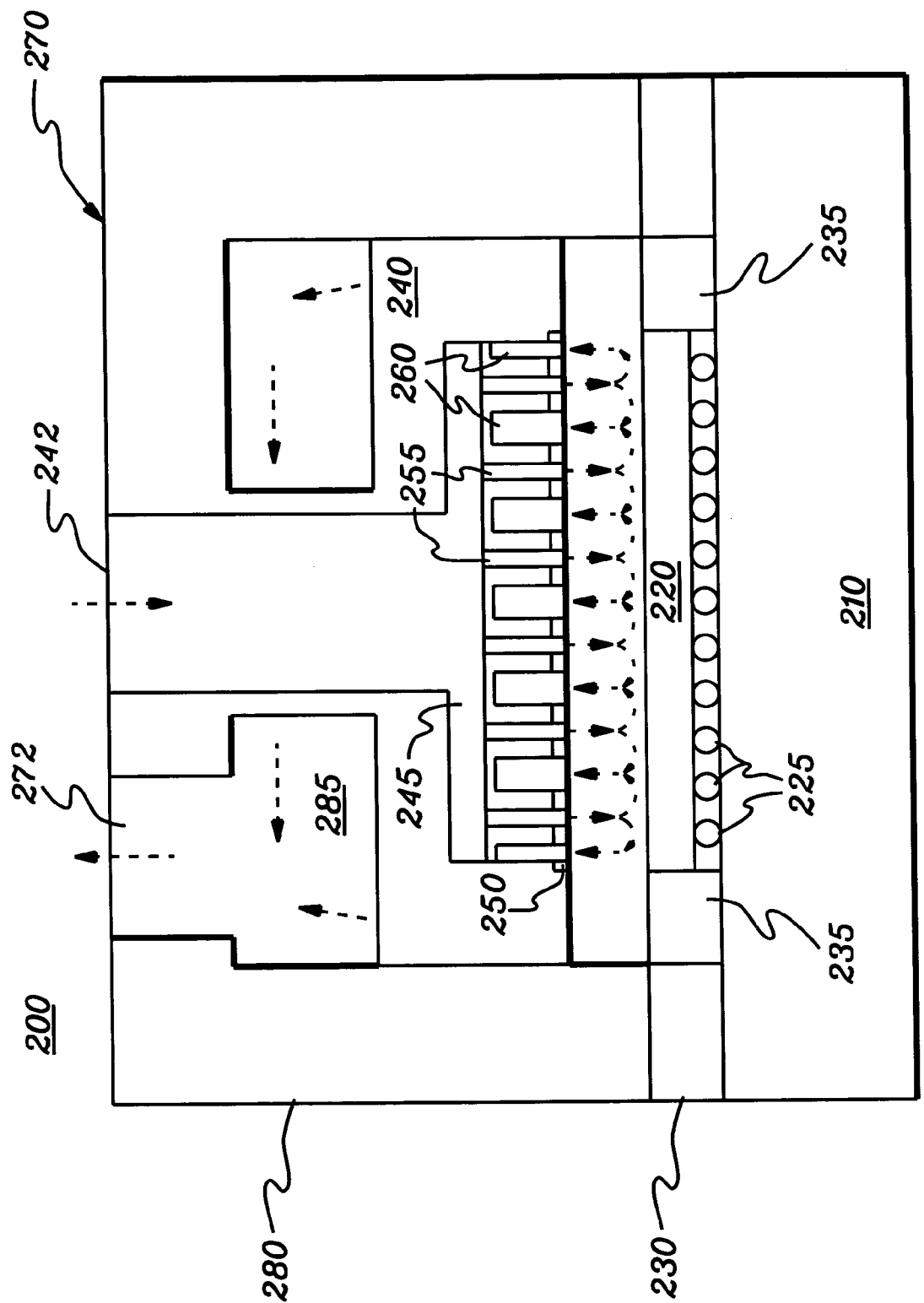
FIG. 2 is a cross-sectional elevational view of another embodiment of a cooled electronic module employing an integrated coolant inlet and outlet manifold, in accordance with an aspect of the present invention.

FIG. 2 depicts an alternate embodiment of a cooled electronic module, generally denoted 200, in accordance with another aspect of the present invention. In this embodiment, cooled electronic module 200 again includes a substrate 210, which may include conductive wiring (not shown) on an upper surface thereof and/or imbedded therein. An electronic device 220, such as an integrated circuit chip, is electrically connected to the wiring of the substrate 210 via, for example, solder ball connections 225. A sealing structure 230 facilitates isolation of the active circuit portion of electronic device 220 (as well as connections 225 and the substrate surface metallurgy) from coolant within the module. Sealant 235 provides a fluid-tight seal between electronic device 220 and sealing structure 230. A housing 270, which is sealed to sealing structure 230 via, for example, solder or brazing, includes an inlet plenum housing 240 and an outlet plenum housing 280.

In this embodiment, inlet plenum housing 240 includes an inlet plenum 245 which receives coolant via at least one inlet port 242 and provides the coolant to an integrated manifold having a plurality of inlet slots 255, which extend between inlet plenum 245 and an orifice plate 250 of the manifold. In this embodiment, a plurality of outlet slots 260 are also provided in the manifold, parallel and interdigitized with the plurality of inlet slots 255. As illustrated further below in connection with embodiment of FIGS. 3A–6, these outlet slots 260 exhaust coolant through a plurality of exit openings in at least one edge surface of the integrated coolant inlet and outlet manifold to an outlet plenum 285, from which the exhausted coolant exits through at least one exit port 272 in the housing 270.

In one embodiment, the plurality of outlet slots 260 are parallel coolant return passages provided in the integrated manifold structure to allow coolant to immediately leave the electronic device vicinity after cooling the surface via jet impingement. This is illustrated by the arrow directional flows in FIG. 2 wherein coolant is expelled through the jet orifices and impinges on the surface of the electronic device, is turned by the surface to be cooled and withdrawn through the plurality of outlet openings in fluid communication with the plurality of outlet slots 260. Advantageously, the integrated manifold structure disclosed herein reduces pressure drop through the manifold, especially for two-phase designs and allows exhaust coolant (liquid or vapor) to immediately exit after cooling the surface to be cooled. Further, a lower coolant temperature across the surface to be cooled in a single-phase system, and a reduced vapor build up in a two-phase system, is achieved, thus increasing the maximum allowable device heat flux. Still further, the design of FIG. 2 eliminates the effluent wash effect of FIG. 1, leading to a relatively uniform heat transfer coefficient on the surface that is to be cooled. The design of the integrated manifold and a fabrication approach therefore is described further below with respect to FIGS. 3A–6.

FIGS. 3A & 3B depict fabrication of a manifold subassembly, generally denoted 300, in accordance with an aspect of the present invention. This subassembly can be fabricated by machining thin slots into two different metal plates 310, 320 having (by way of example) the geometry shown in FIG. 3A. Those skilled in the art should note, however, that the geometry and thickness of one or more of the different plates can vary, as well as the depth and configuration of the slots machined therein, without departing from the scope of the present invention. In one implementation, the metal plates might comprise stainless steel or copper. After machining a plurality of these plates, for example, by skiving or etching, the plates are assembled with end capping structures 330, 340 into a stack subassembly as shown in FIG. 3B. Specifically, the two different types of plates 310, 320 are stacked in an alternate manner and joined using a brazing, solder, or comparable process (e.g., diffusion bonding). As shown in FIG. 3B, the resultant stack subassembly has a plurality of interdigitated slots 350, 360. In addition, exit openings 365 in two edge surfaces of the stack are in fluid communication with slots 360 (which are to comprise the outlet slots).

Figure 4B:
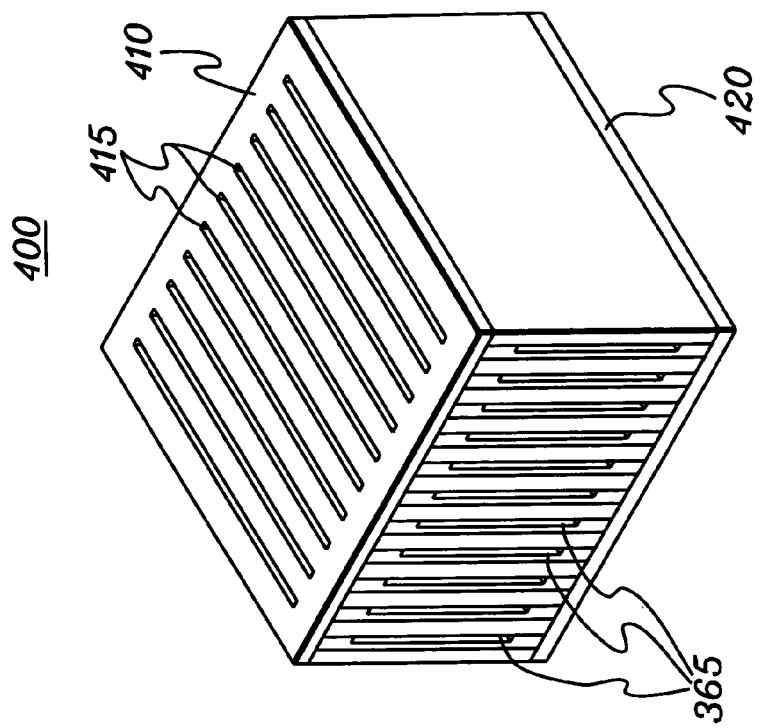
FIG. 4B is an isometric view of the assembled manifold of FIG. 4A, in accordance with an aspect of the present invention.
Figure 4A:
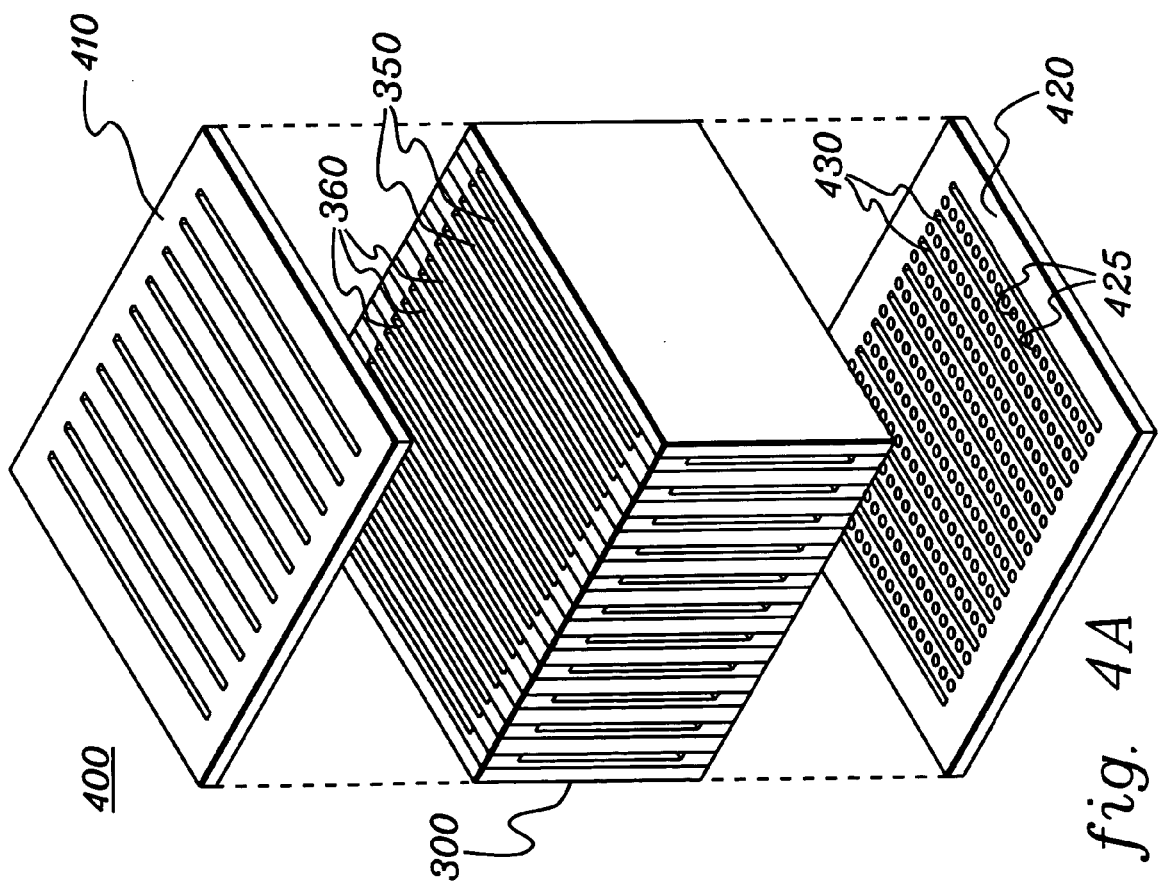
FIG. 4A is a partially exploded, isometric view of an integrated coolant inlet and outlet manifold, employing the stack subassembly of FIG. 3B, as well as an inlet manifold plate and an orifice plate, in accordance with an aspect of the present invention.

FIGS. 4A & 4B depict a next assembly step, wherein slots 360 are sealed or blocked at one main surface of the stack by the joining of an inlet cover plate 410 to the stack. Inlet manifold plate 410 includes a plurality of rectangular-shaped inlet openings 415, which are disposed to align with the plurality of inlet slots 350 in stack 300. Openings 415 allow the transport of inlet coolant from the inlet plenum (not shown) to, for example, jet orifices 425 in an orifice plate 420. As shown in FIG. 4A, orifice plate 420 is joined to the other main surface of manifold subassembly 300. Plate 420, in addition to having a plurality of inlet orifices 425, includes a plurality of outlet openings 430 which align to the plurality of outlet slots 360 in stack 300. As also shown in FIG. 4A, in this embodiment, multiple inlet orifices 425 are aligned in multiple rows, and the multiple rows are parallel and interdigitized with the plurality of elongated outlet openings 430. Inlet manifold plate 410 and orifice plate 420 are joined to subassembly 300, by brazing or soldering, to form the integrated coolant inlet and outlet manifold 400 of FIG. 4B.

Referring to FIG. 4B, when operational coolant flows through the inlet port into the inlet plenum, and then moves through the aligned inlet slots 415 in inlet manifold plate 410 and thereafter through the jet orifices in the orifice plate to impinge on the surface of the electronic device to be cooled (not shown). After impingement, and subsequent to heat removal from the surface to be cooled, heated coolant leaves the space defined between the opposing orifice plate 420 and surface of the electronic device being cooled through the nearest outlet opening 430 in the integrated manifold 400. Once passing through an outlet opening, the heated coolant bifurcates within the respective outlet slot 360 and turns 90 degrees to leave the integrated manifold through the corresponding exit openings 365 in the two side surfaces of manifold 400. Thus, the direction of coolant flow exhausted from the exit openings 365 in the side surfaces of integrated manifold 400 is perpendicular to the direction of intake of exhausted coolant through outlet openings 430 at the common inlet and outlet surface of the integrated manifold defined by orifice plate 420.

Figure 5B:
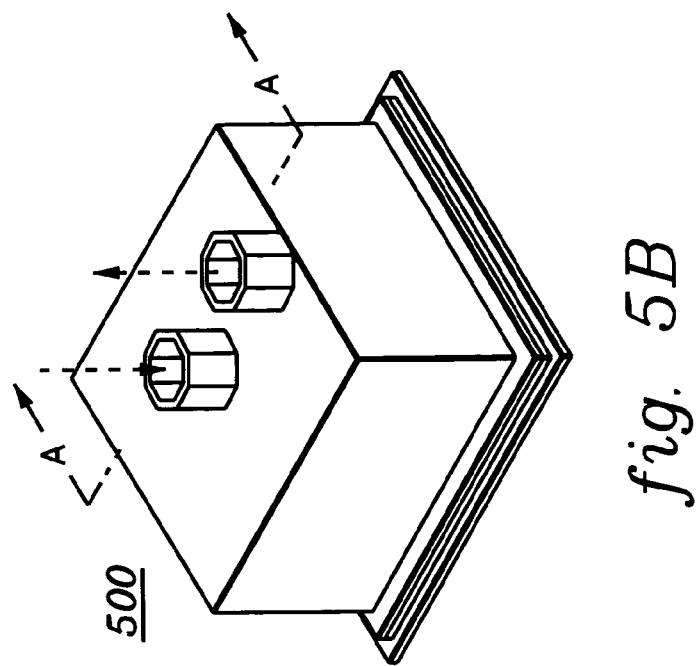
FIG. 5B is an isometric view of the assembled cooled electronic module of FIG. 5A, in accordance with an aspect of the present invention.
Figure 5A:
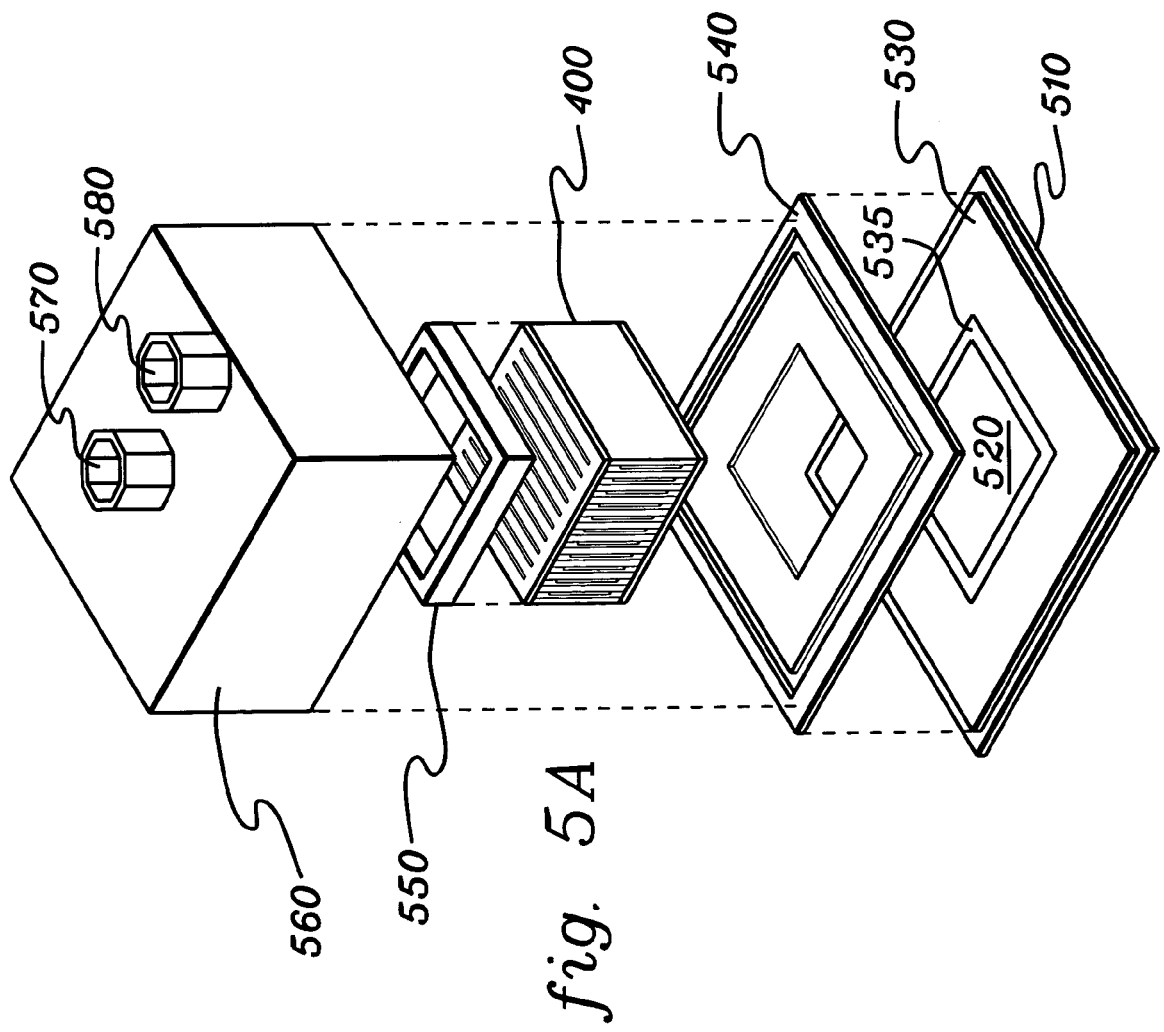
FIG. 5A is a partially exploded, isometric view of a cooled electronic module employing a cooling apparatus comprising the assembled manifold of FIG. 4B, in accordance with an aspect of the present invention.

FIGS. 5A & 5B depict one embodiment of a cooled electronic module, generally denoted 500, in accordance with an aspect of the present invention. As shown in the exploded view of FIG. 5A, module 500 includes a substrate 510, an electronic device 520, sealing structure 530 and sealant 535. As noted in connection with the embodiment of FIG. 2, sealant 535 forms a fluid-tight seal between electronic device 520 and sealing structure 530. Further details and embodiments of the sealing structure and sealant are described in detail in the above-incorporated application entitled "Fluidic Cooling Systems and Methods for Electronic Components." In this embodiment, a cooling module bottom plate 540 creates a separation between the inlet orifices of manifold 400 and the electronic device to be cooled. The center opening in bottom plate 540 is somewhat smaller than the size of the assembled integrated manifold 400 so that manifold 400 is supported in spaced relation to the electronic device 520. An inlet plenum housing 550 is sealed to an upper portion of the integrated manifold 400 and an exit plenum housing 560 seals to bottom plate 540. Coolant is provided through an inlet port 570 in housing 560 and is exhausted through an exit port 580 in housing 560.

FIG. 6 is a cross-sectional elevational view of the assembled cooled electronic module 500 of FIGS. 5A & 5B, taken along lines A—A of FIG. 5B. As shown, coolant enters through inlet port 570 and is distributed through the inlet plenum into inlet slots 350 aligned with slots 415 in inlet manifold plate 410. The coolant then passes through one or more jet orifices 425 (in fluid communication with their respective inlet slot) and impinges upon the surface of the electronic device 520 to be cooled. As noted above, electronic device 520 resides on a substrate and is sealed to a sealing structure 530 by sealant 535. Bottom plate 540 resides atop sealing structure 530 and sealant 535. After impinging on the electronic device, the coolant is exhausted through an adjacent outlet opening 430 into a respective outlet slot 360. Within the outlet slots 360, coolant bifurcates and exhausts through exit openings 365 (see FIG. 4B) in the two edge surfaces of integrated manifold 400. The exhausted coolant is collected in the outlet plenum 585 and is removed through exit port 580.

Figure 7:
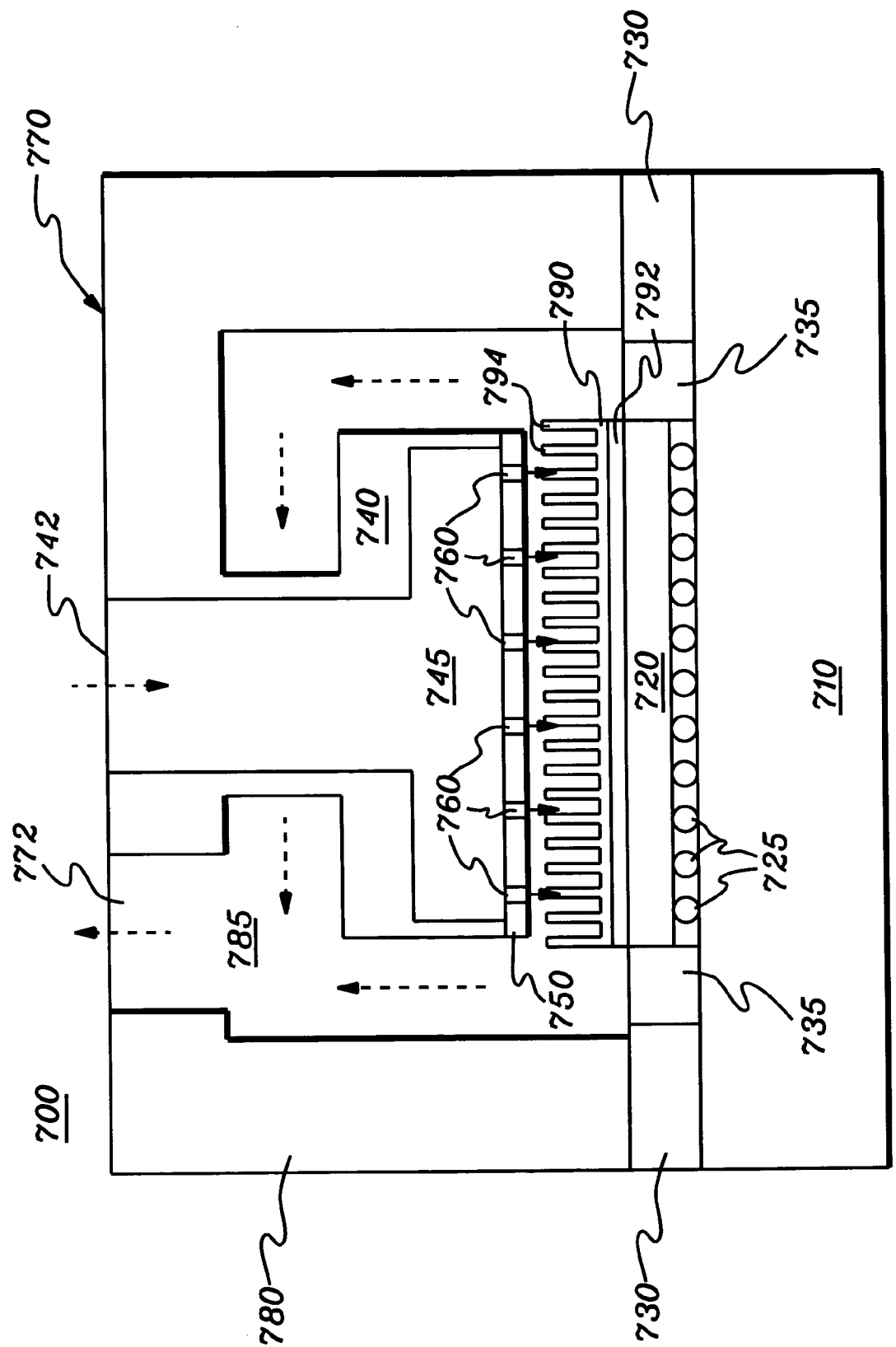
FIG. 7 is a cross-sectional elevational view of another embodiment of a cooled electronic module, in accordance with an aspect of the present invention.
Figure 8:
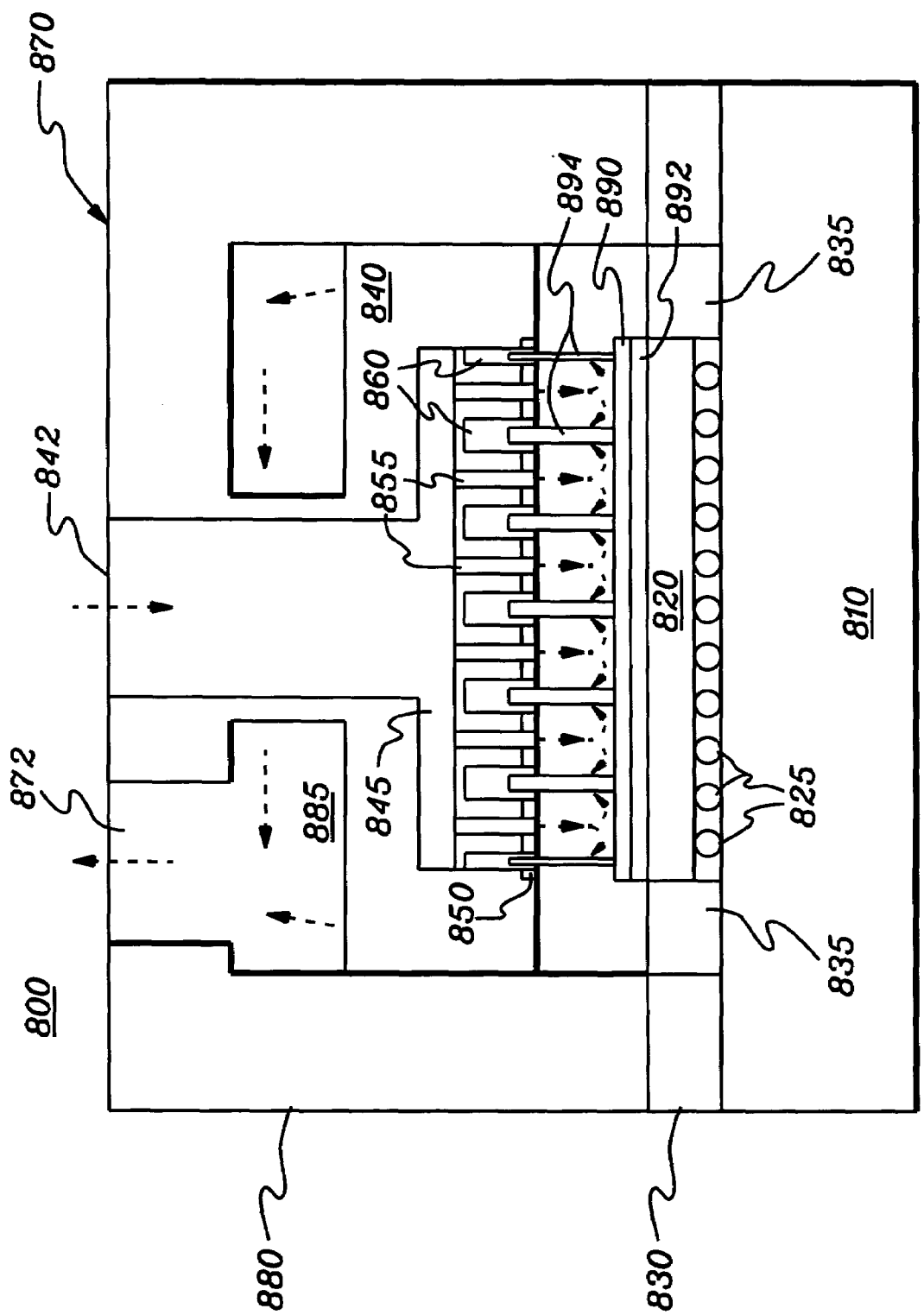
FIG. 8 is a cross-sectional elevational view of yet another embodiment of a cooled electronic module employing a plurality of thermally conductive fins in combination with an integrated coolant inlet and outlet manifold, in accordance with an aspect of the present invention.

Further embodiments of a cooled electronic module and cooling apparatus in accordance with aspects of the present invention are depicted in FIGS. 7 & 8, and described below.

In the embodiment of FIG. 7, a cooled electronic module 700 includes a substrate 710, having similar characteristics to the substrates described above in connection with FIGS. 1, 2 & 6. An electronic device 720 is electrically connected to substrate 710 via, for example, solder ball connections 725. A sealing structure 730, which again could comprise a plate with a center opening, facilitates isolation of the active portion of the electronic device 720 (as well as connections 725 and the substrate surface metallurgy) from coolant within the module. A sealant 735, such as epoxy, provides a fluid-tight seal between sealing structure 730 and electronic device 720. This seal is desirable particularly if the coolant is aqueous in nature. The housing 770 includes an inlet plenum housing 740 and an outlet plenum housing 780. Inlet plenum housing 740 includes an inlet plenum 745 which receives coolant through at least one inlet opening 742 and directs coolant through a plurality of orifices 760, disposed in an orifice plate 750, onto the surface to be cooled. In one embodiment, orifices 760 comprise jet orifices which provide an impinging jet flow onto the surface to be cooled. After impinging on the surface to be cooled, the coolant flows outward towards the periphery of the electronic device, where it turns upwards and exits through an outlet plenum 785 via at least one outlet port 772.

In this embodiment, a heat sink structure 790 (e.g., a micro-scaled structure) is coupled to electronic device 720 via a thermal interface 792. This interface may comprise silicone, epoxy, solder, etc. Heat sink structure 790 comprises a thermally conductive base having a main surface with a plurality of thermally conductive fins 794 extending therefrom to facilitate transfer of heat from the base, and hence from electronic device 720.

In operation, several drawbacks to a cooled electronic module as depicted in FIG. 7 may arise. For example, there may be a high pressure drop in a single phase coolant embodiment, and a prohibitive pressure drop in a two-phase coolant environment due to collection of coolant (liquid or vapor) between the orifice plate and the heat sink structure. Additionally, cooling jets are most effective at a small separation, while fins should be relatively tall to enhance surface area and therefore dissipation of heat. Further, peripheral return of exhausted coolant may be limiting, for example, in terms of fin density and coolant temperature rise.

These drawbacks are avoided with an alternate embodiment of a cooled electronic module, generally denoted 800, such as depicted in FIG. 8. In this embodiment, cooled electronic module 800 again includes: a substrate 810; an electronic device 820 electrically connected to substrate 810 via connections 825; a sealing structure 830 for facilitating isolation of the active circuit portion of the electronic device 820 (and connections 825 and the substrate surface metallurgy) from coolant within the module; and a sealant 835 providing a fluid-tight seal between electronic device 820 and sealing structure 830. A housing 870 is sealed to sealing structure 830 via, for example, solder or braising, and includes an inlet plenum housing 840 and an outlet housing plenum 880.

In this embodiment, inlet plenum housing 840 includes an inlet plenum 845 which receives coolant via at least one inlet port 842 and provides the coolant to an integrated manifold having a plurality of inlet slots 855, which extend between inlet plenum 845 and an orifice plate 850 of the manifold. A plurality of outlet slots 860 are also provided in the manifold, parallel and interdigitized with the plurality of inlet slots 855. As illustrated above in connection with FIGS. 3A–6, these outlet slots 860 exhaust coolant through a plurality of exit openings in at least one edge surface of the integrated manifold to an outlet plenum 885, from which the exhausted coolant exits through at least one exit port 872 in housing 870.

In one embodiment, the plurality of outlet slots 860 are parallel coolant return passages provided in the integrated manifold to allow coolant to immediately leave the electronic device vicinity after cooling the surface to be cooled via jet impingement. This is illustrated by the directional arrow flows in FIG. 8, wherein coolant is expelled through the jet orifices and impinges on the surface to be cooled, is turned by the surface to be cooled and withdrawn through the plurality of outlet openings in fluid communication with the plurality of outlet slots 860.

As shown in FIG. 8, a heat sink structure 890 (e.g., a micro-scaled structure) is coupled to electronic device 820 via a thermal interface 892, which again could comprise silicone, epoxy, solder, etc. Extending from a main surface of heat sink structure 890 are a plurality of thermally conductive fins 894. At least some of these thermally conductive fins are disposed and sized to extend through corresponding outlet openings into respective outlet slots 860 comprising the exhaust coolant return passages. In the embodiment of FIG. 8, outlet slots at either end of the integrated manifold are shown with a smaller characteristic dimension than those in the center portion of the integrated manifold. This is because these peripherally located outlet slots are exhausting coolant from fewer inlet slots 855. Thermally conductive fins 894 are correspondingly sized so as to pass through these outlet openings and extend into these smaller outlet slots. This could be achieved, for example, by machining differently the appropriate plates near the ends of the stack of FIG. 3B.

The imbedding or inserting of the conductive fins into the outlet openings of the coolant return passages allows the jet impingement to be very close to the surface to be cooled, thus enhancing heat transfer, while at the same time permitting the fins to be taller, thus providing a larger surface area for expelling heat without affecting pressure drop through the cooling apparatus. In the embodiment of FIG. 8, coolant washes over the fins while the coolant is exiting, thereby utilizing low momentum fluid to cool the fins. Further, hot coolant (or vapor) exits immediately after passing over the thermally conductive fins.

Jet impingement is an effective cooling approach because the impinging fluid causes the boundary layer to be very thin, thus resulting in good heat transfer. For a jet to possess sufficient momentum to impinge on a surface and result in superior heat transfer, the jet velocity needs to be relatively high. As jet velocity increases, so does the pressure drop associated with the jet's creation. In electronic cooling approaches, jet velocities for cooling integrated circuit chips are likely to be in the 2.5–15 m/s range. For these velocities, it is expected that the jet would need to be close to the surface being cooled, e.g., as close as 0.1–1.0 mm. Inlet orifice-to-surface spacing is preferably less than four times the orifice characteristic dimension, where the orifice characteristic dimension is defined as four times the orifice open area divided by the perimeter of the orifice open area. For example, the orifice characteristic dimension for a circular orifice is equal to the orifice diameter, and the orifice characteristic dimension for a square orifice is equal to the length of one side of the square. Thus, the use of the cooling apparatus of FIG. 8 enables the jet impingement with very small jet orifice-to-surface distance, while maintaining a relatively tall fin height, i.e., a height greater than the jet orifice-to-surface distance. When fin heights are smaller than 0.5 mm, the pressure drop associated with coolant flowing through the fin arrays may be too high. Thus, the cooling embodiment of FIG. 8 allows for a favorable combination of jet impingement and finned cooling, and results in high thermal performance at relatively low pressures. Computer based simulations of a representative design of this structure show substantial thermal performance of 350 W/sq. cm for a low pressure drop of 1.1 psi.

Those skilled in the art should note that although described above with reference to a separate heat sink structure 890, the thermally conductive fins 894 could attach directly to a main surface of electronic device 820. Further, the shape and size of fins 894 can vary. For example, fins 894 could comprise pin fins or plate fins depending, at least in part, on the configuration of the outlet openings of the plurality of outlet slots 860.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus comprising:
    a plurality of thermally conductive fins coupled to and projecting away from a surface to be cooled, the plurality of thermally conductive fins facilitating transfer of heat from the surface to be cooled;
    an integrated manifold having a plurality of inlet orifices for injecting coolant onto the surface to be cooled, and a plurality of outlet openings for exhausting coolant after impinging on the surface to be cooled;
    wherein the plurality of inlet orifices and the plurality of outlet openings are interspersed in a common surface of the integrated manifold, and the integrated manifold and the surface to be cooled are disposed with the common surface of the integrated manifold and the surface to be cooled in spaced, opposing relation, and with the plurality of thermally conductive fins disposed therebetween; and
    wherein at least some fins of the plurality of thermally conductive fins are sized and disposed to extend into at least some outlet openings of the plurality of outlet openings of the integrated manifold to facilitate heat transfer from the surface to be cooled to the coolant.

2. The cooling apparatus of claim 1, wherein the plurality of inlet orifices comprise a plurality of jet orifices for providing jet impingement of coolant onto the surface to be cooled, and wherein when operational, coolant cools the plurality of fins after impinging on the surface to be cooled.

3. The cooling apparatus of claim 2, wherein the common surface of the integrated manifold and the surface to be cooled are spaced less than or equal to 1 mm apart, and wherein the height of each fin of the at least some fins extending into the at least some outlet openings of the integrated manifold is greater than the spacing between the common surface and the surface to be cooled.

4. The cooling apparatus of claim 2, wherein the plurality of thermally conductive fins comprise at least one of a plurality of thermally conductive pin fins and a plurality of thermally conductive plate fins.

5. The cooling apparatus of claim 1, further comprising a thermally conductive base having a main surface, wherein the surface to be cooled is the main surface of the thermally conductive base.

6. The cooling apparatus of claim 1, wherein the integrated manifold further comprises a plurality of exit openings in at least one edge surface of the integrated manifold, the plurality of exit openings being in fluid communication through the integrated manifold with the plurality of outlet openings to facilitate exhausting of coolant through the plurality of outlet openings and minimize pressure drop through the integrated manifold, and wherein at least one surface plane projection of the at least one edge surface intersects a surface plane projection of the common surface.

7. The cooling apparatus of claim 6, wherein the integrated manifold further comprises a plurality of inlet slots and a plurality of outlet slots disposed therein, the plurality of inlet slots being in fluid communication with the plurality of inlet orifices for facilitating injecting of coolant onto the surface to be cooled, and the plurality of outlet slots being in fluid communication with the plurality of outlet openings and the plurality of exit openings for facilitating exhausting of coolant after impinging on the surface to be cooled, and wherein the plurality of inlet slots are disposed parallel and interdigitized with the plurality of outlet slots within the integrated manifold.

8. A cooled electronic module comprising:
    a substrate;
    at least one heat generating electronic device to be cooled coupled to the substrate; and
    a cooling apparatus for cooling the at least one heat generating electronic device, the cooling apparatus comprising:
        a thermally conductive base having a main surface, the thermally conductive base comprising part of or being coupled to the at least one heat generating electronic device to facilitate transfer of heat from the at least one heat generating electronic device;
        a plurality of thermally conductive fins extending from the main surface of the thermally conductive base to facilitate transfer of heat from the thermally conductive base;

an integrated manifold having a plurality of inlet orifices for injecting coolant onto the main surface of the thermally conductive base, and a plurality of outlet openings for exhausting coolant after impinging on the main surface of the thermally conductive base;

wherein the plurality of inlet orifices and the plurality of outlet openings are interspersed in a common surface of the integrated manifold, and the integrated manifold and the thermally conductive base are disposed with the common surface of the integrated manifold and the main surface of the thermally conductive base in spaced, opposing relation, and with the plurality of thermally conductive fins disposed therebetween; and wherein the integrated manifold further comprises a plurality of exit openings in at least one edge surface of the integrated manifold, the plurality of exit openings being in fluid communication through the integrated manifold with the plurality of outlet openings to facilitate exhausting of coolant through the plurality of outlet openings and minimize pressure drop through the integrated manifold, and wherein at least one surface plane projection of the at least one edge surface intersects a surface plane projection of the common surface.

9. The cooled electronic module of claim 8, wherein at least some fins of the plurality of thermally conductive fins are sized and disposed to extend into at least some outlet openings of the plurality of outlet openings of the integrated manifold to facilitate heat transfer from the main surface of the thermally conductive base to the coolant.

10. The cooled electronic module of claim 9, wherein the plurality of inlet orifices comprise a plurality of jet orifices for providing jet impingement of coolant onto the main surface of the thermally conductive base, and wherein when operational, coolant cools the plurality of fins after impinging on the main surface of the thermally conductive base.

11. The cooled electronic module of claim 10, wherein the common surface of the integrated manifold and the main surface of the thermally conductive base are spaced less than or equal to 1 mm apart, and wherein the height of each fin of the at least some fins extending into the at least some outlet openings of the integrated manifold is greater than the spacing between the common surface and the surface to be cooled.

12. The cooled electronic module of claim 10, wherein the plurality of thermally conductive fins comprise at least one of a plurality of thermally conductive pin fins and a plurality of thermally conductive plate fins.

13. The cooled electronic module of claim 8, wherein the integrated manifold further comprises a plurality of inlet slots and a plurality of outlet slots disposed therein, the plurality of inlet slots being in fluid communication with the plurality of inlet orifices for facilitating injecting of coolant onto the main surface of the thermally conductive base, and the plurality of outlet slots being in fluid communication with the plurality of outlet openings and the plurality of exit openings for facilitating exhausting of coolant after impinging on the main surface of the thermally conductive base, and wherein the plurality of inlet slots are disposed parallel and interdigitized with the plurality of outlet slots within the integrated manifold.

14. A method of fabricating a cooling apparatus comprising:

(i) providing a plurality of thermally conductive fins coupled to and projecting away from a surface to be cooled, the plurality of thermally conductive fins facilitating transfer of heat from the surface to be cooled;

(ii) providing an integrated manifold having a plurality of inlet orifices for injecting coolant onto the surface to be cooled, and a plurality of outlet openings for exhausting coolant after impinging on the surface to be cooled;

(iii) wherein the plurality of inlet orifices and the plurality of outlet openings are interspersed in a common surface of the integrated manifold, and the integrated manifold and the surface to be cooled are disposed with the common surface of the integrated manifold and the surface to be cooled in spaced, opposing relation, and with the plurality of thermally conductive fins disposed therebetween; and (iv) wherein the providing (i) further comprises sizing and disposing at least some fins of the plurality of thermally conductive fins to extend into at least some outlet openings of the plurality of outlet openings of the integrated manifold to facilitate heat transfer from the surface to be cooled to the coolant.

15. The method of claim 14, wherein the plurality of inlet orifices comprise a plurality of jet orifices for providing jet impingement of coolant onto the surface to be cooled, and wherein when operational, coolant cools the plurality of fins after impinging on the surface to be cooled.

16. The method of claim 15, wherein the common surface of the integrated manifold and the surface to be cooled are spaced less than or equal to 1 mm apart, and wherein the height of each fin of the at least some fins extending into the at least some outlet openings of the integrated manifold is greater than the spacing between the common surface and the surface to be cooled.

17. The method of claim 14, wherein the providing (ii) further comprises providing the integrated manifold with a plurality of exit openings in at least one edge surface of the integrated manifold, the plurality of exit openings being in fluid communication through the integrated manifold with the plurality of outlet openings to facilitate exhausting of coolant through the plurality of outlet openings and minimize pressure drop through the integrated manifold, and wherein at least one surface plane projection of the at least one edge surface intersects a surface plane projection of the common surface.

* * * * *